United States Patent
Minsek et al.

(10) Patent No.: US 6,716,568 B1
(45) Date of Patent: Apr. 6, 2004

(54) EPOXY PHOTORESIST COMPOSITION WITH IMPROVED CRACKING RESISTANCE

(75) Inventors: David W. Minsek, Pleasantville, NY (US); Eric L. Alemy, Landing, NJ (US)

(73) Assignee: Microchem Corp., Newton, MA (US)

( * ) Notice: Subject to any disclaimer, the term of this patent is extended or adjusted under 35 U.S.C. 154(b) by 98 days.

(21) Appl. No.: 09/942,521

(22) Filed: Aug. 29, 2001

Related U.S. Application Data

(60) Provisional application No. 60/232,743, filed on Sep. 15, 2000.

(51) Int. Cl.$^7$ .............................. G03F 7/038; G03F 7/38
(52) U.S. Cl. .................. 430/280.1; 430/325; 430/330; 430/311; 430/272.1; 430/275.1
(58) Field of Search .................. 430/330, 325, 430/311, 272.1, 275.1

(56) References Cited

U.S. PATENT DOCUMENTS

| | | | | |
|---|---|---|---|---|
| 4,256,828 A | | 3/1981 | Smith | 430/280.1 |
| 4,474,929 A | * | 10/1984 | Schrader | 525/482 |
| 4,882,245 A | | 11/1989 | Gelorme et al. | 430/280.1 |
| 4,940,651 A | | 7/1990 | Brown et al. | 430/280.1 |
| 5,026,624 A | | 6/1991 | Day et al. | 430/280.1 |
| 5,043,221 A | | 8/1991 | Koleske | 428/413 |
| 5,098,616 A | | 3/1992 | King et al. | 430/280.1 |
| 5,102,772 A | | 4/1992 | Angelo et al. | 430/280.1 |
| 5,278,010 A | | 1/1994 | Day et al. | 430/280.1 |
| 5,304,457 A | | 4/1994 | Day et al. | 430/280.1 |
| 5,726,216 A | * | 3/1998 | Janke et al. | 522/31 |
| 5,859,655 A | | 1/1999 | Gelorme et al. | 204/501 |

OTHER PUBLICATIONS

Crivello et al. "Photoinitiated Catronic Polymerization with Triarylsulfonium Salts", Journal of Polymer Science: Polymer Chemistry Edition, vol. 17, pp. 977–999 (1979).
N. La Branca and J.D. Gelorme, "High Aspect Ratio Resist for Thick Film Applications", Proc. SPIE, vol. 2438, pp. 846–852 (1995).
K.Y. Lee et al., "Micromachining applications of a high resolution ultrathick photoresist", J. Vac. Sci. Technology B 13(6), Nov./Dec. 1995.
Sotec Microsystems Photoepoxies Product Brochure.

* cited by examiner

Primary Examiner—Cynthia Hamilton
(74) Attorney, Agent, or Firm—Wiggin & Dana LLP; William A. Simons; Elizabeth A. Geschke

(57) ABSTRACT

A photoimageable composition suitable for use as a negative photoresist comprising about 75% to about 95% by weight of at least one epoxidized polyfunctional bisphenol A formaldehyde novolak resin; about 5% to about 25% by weight of at least one polyol reactive diluent; and at least one photoacid generator in an amount from about 2.5 to about 12.5 parts per hundred parts of resin and reactive diluent, which initiates polymerization upon exposure to near-ultraviolet radiation; dissolved in a sufficient amount of coating solvent.

14 Claims, No Drawings

EPOXY PHOTORESIST COMPOSITION WITH IMPROVED CRACKING RESISTANCE

This application claims benefit of provisional application No. 60/232,743, filed Sep. 15, 2000.

BACKGROUND OF THE INVENTION

1. Field of the Invention

The present invention relates to photoimageable epoxy compositions useful as photoresists for applications requiring thick films. In particular, this invention relates to specific compositions useful for that purpose that include at least one solvent, at least one epoxidized bisphenol A formaldehyde novolak resin, at least one polyol reactive diluent and at least one photoacid generator.

2. Brief Description of Art

Photoimageable coatings are currently used in a wide variety of semiconductor and micromachining applications, where photoimaging is accomplished by exposure to patterned radiation of a coating on a substrate, where the radiation induces a solubility change of the coating in a developer, such that the exposed or unexposed regions can be selectively developed away. The photoimageable coating (photoresist) may be either of the positive or negative type, where exposure to radiation increases or decreases the developer solubility, respectively. Advanced packaging applications requiring solder bumps having a high aspect ratio (defined as the height to width ratio of the imaged feature), or applications involving the fabrication of micro electromechanical devices (MEMS) require photoresists which are capable of producing uniform spin-coated films and high aspect ratio images of greater than one hundred microns thickness. Conventional positive resists based on diazonaphthoquinone-novolak chemistry are not suitable for applications for which the thickness is required to be greater than about 50 microns. This thickness limitation is caused by the relatively high optical absorption of the diazonaphthoquinone-type (DNQ) photoactive compound in the near-ultraviolet region of the optical spectrum (350–450 nm) which is typically used to expose the resist. Also, DNQ-type of photoresist possesses limited contrast, or differential solubility, of the exposed vs. unexposed resist in a developer solution. Optical absorption necessarily reduces the radiation intensity as it traverses from the top to the bottom of the film, such that if the optical absorption is too high the bottom of the film will be underexposed relative to the top, causing a tapered or otherwise distorted profile of the developed image.

A negative, spin-coated, thick-film photoresist of the chemically amplified type, which has a very low optical absorbance at wavelengths in the 350–450 nm range has been described in the literature (N. LaBianca and J. D. Gelorme, "High Aspect Ratio Resist for Thick Film Applications", Proc. SPIE, vol. 2438, p. 846 (1995)). High aspect ratio (>10:1) photoimaging was demonstrated in 200 micron thick films. This resist comprises a solution in a casting solvent of a highly branched eight functional epoxy novolak resin, EPON® SU-8 from Shell Chemical Company, and a photoacid generator (PAG) such as CYRACURE® UVI 6974 from Union Carbide which consists of a triarylsulfonium hexafluoroantimonate salt. Suitable photoacid generators based on sulfonium salts are well-known and have been extensively discussed in the literature (see for ex. Crivello et al., "Photoinitiated Cationic Polymerization with Triarylsulfonium Salts", Journal of Polymer Science: Polymer Chemistry Edition, vol. 17, pp. 977–999 (1979).) The photoacid generator is added at concentrations of less than 10% by weight of the total solids in order to keep the optical transparency sufficiently high to maintain nearly uniform radiation intensity through the film thickness. The resulting photoresist formulation may be spin-coated onto a wide variety of substrates, pre-baked to evaporate solvent, leaving a solid photoresist coating of one hundred microns or greater thickness which may be photoimaged by exposure to near-ultraviolet radiation through a patterned photomask by contact, proximity, or projection exposure. Subsequent immersion in a developer solution dissolves away the unexposed regions, leaving behind a high resolution, three dimensional, negative image of the photomask.

EPON® SU-8 is a low molecular weight epoxy-functional polymer that has several characteristics making it advantageous for high aspect ratio photoimaging: (1) it has a high average epoxide functionality (eight), (2) a high degree of branching, (3) high transparency from 350–450 nm, and (4) the molecular weight is sufficiently low to allow high solids formulation, assisting in the application of defect-free thick films. The high functionality and branching result in efficient crosslinking under the influence of strong acid catalysts, while the high transparency allows uniform irradiation through thick films, making the resist capable of forming images with aspect ratio of greater than 10:1 at film thicknesses of greater than 100 microns. Photoresist formulations based on EPON® SU-8 are currently commercially available from MicroChem Corp. (Newton, Mass., USA) under the general name SU-8.

U.S. Pat. Nos. 4,882,245 and 4,940,651 assigned to International Business Machines Corp. disclose a photoimageable cationically polymerizable composition for use in printed circuit boards which consists of a mixture of up to 88% epoxidized bisphenol A formaldehyde novolak resin with average epoxide functionality of eight and a reactive diluent which serves as a plasticizer, and a cationic photoinitiator. Reactive diluents disclosed were difunctional or trifunctional epoxide compounds, preferably at 10–35% by weight solids. However, no polyol reactive diluents were disclosed.

U.S. Pat. Nos. 5,026,624, 5,278,010, and 5,304,457 assigned to International Business Machines Corp. disclose a photoimageable cationically polymerizable composition suitable for use as a solder mask, which consists of a mixture of the 10–80% condensation product of bisphenol A and epichlorohydrin, 20–90% of epoxidized bisphenol A formaldehyde novolak resin, and 35–50% by weight of epoxidized glycidyl ether of tetrabromobisphenol A, with 0.1–15 parts per hundred by weight of a cationic photoinitiator. No polyol reactive diluents were disclosed. Curtain coating, roll coating, and wound wire rod coating were used.

U.S. Pat. No. 5,102,772 assigned to International Business Machines Corp. discloses photocurable epoxy compositions consisting of a mixture of the epoxidized bisphenol A formaldehyde novolak and a difunctional cycloaliphatic epoxy compound and/or trifunctional aromatic epoxy compound, and a sulfonium hexafluoroantimonate salt photoinitiator. No polyol reactive diluents were disclosed.

U.S. Pat. No. 4,256,828 assigned to Minnesota Mining and Manufacturing Co. discloses a photopolymerizable composition based on an epoxy resin of functionality greater than 1.5, a hydroxyl-containing additive, and a photoacid generator. The hydroxyl-containing additive is reported to increase flexibility and decrease shrinkage for coatings of up to 100 microns thickness. However, the intended application was for UV-curable coatings. Furthermore, use of a highly branched, eight functional epoxy novolak resin for the purpose of high aspect ratio photoimaging was not disclosed.

U.S. Pat. No. 5,043,221 assigned to Union Carbide discloses a photopolymerizable conformal coating for printed circuit boards based on an cycloaliphatic epoxy resin, a polyether polyol additive, and a photoinitiator. However, use of a highly branched, eight functional epoxy novolak resin for the purpose of high aspect ratio photoimaging was not disclosed.

While the EPON® SU-8 resin based compositions disclosed previously are capable of very high resolution and aspect ratio, the cured material has a tendency to be brittle, and may undergo stress-induced cracking and delamination of the coating from the substrate. Both the cracking and delamination is exacerbated by the shrinkage-induced stress that occurs when the material undergoes polymerization, which is manifested in substrate bowing, where shrinkage of the coating induces bending (bowing) of the substrate. The present disclosure describes a composition containing polyol reactive diluents which reduces the stress, cracking, and delamination that occur during processing, while maintaining the high resolution capabilities of EPON® SU-8 resin-based photoimageable compositions.

BRIEF SUMMARY OF THE INVENTION

The present invention is directed to a photoimageable composition comprising about 75% to 95% by weight of at least one epoxidized bisphenol A formaldehyde novolak resin, with between 5% and 25% by weight of at least one polycaprolactone polyol reactive diluent, with at least one photoacid generator in the amount of about 2.5 to about 12.5 weight parts per hundred parts resin and reactive diluent, which initiates polymerization upon exposure to near-ultraviolet radiation, dissolved in a sufficient amount of casting solvent. The resulting mixture may be applied to substrates at thicknesses from 1 to greater than 100 microns, exposed to patterned ultraviolet radiation, cured, and developed. The resulting cured, hardened structures are less susceptible to stress, cracking, and delamination than similar compositions without the polyol reactive diluent.

DETAILED DESCRIPTION OF THE INVENTION

As stated above, the present invention is a composition comprising at least one of each of the following:
(a) a particular epoxy resin, preferably EPON® SU-8 Resin, which is capable of undergoing ring-opening polymerization under the influence of a strong acid catalyst,
(b) a polyol reactive diluent which is capable of reacting with the epoxy resin under the influence of a strong acid catalyst, serving as reactive diluent for the epoxy resin,
(c) a photoacid generator which releases a strong acid under the influence of ultraviolet light,
(d) a solvent which is capable of dissolving all ingredients. Optionally, the composition may also contain a surfactant to improve coating uniformity.

The term "epoxidized polyfunctional" as used herein to describe bisphenol A formaldehyde novolak resins includes any and all resins of this class that contain sufficient epoxy functionalities to be useful as a thick film negative photoresist.

The preferred epoxy resin contains an average of eight epoxy groups, consisting of the glycidyl ether of the novolak condensation product of bisphenol A and formaldehyde, with an average molecular weight of about 1400 gram/mole, with an epoxy equivalent weight of about 215 gram/mole, with the average structure shown below as formula (1). Such a described resin is commercially available from Shell Chemical Company under the trade name EPON® Resin SU-8. The structure of the most common component of the resin having an epoxy functionality of 8 is shown in formula (1):

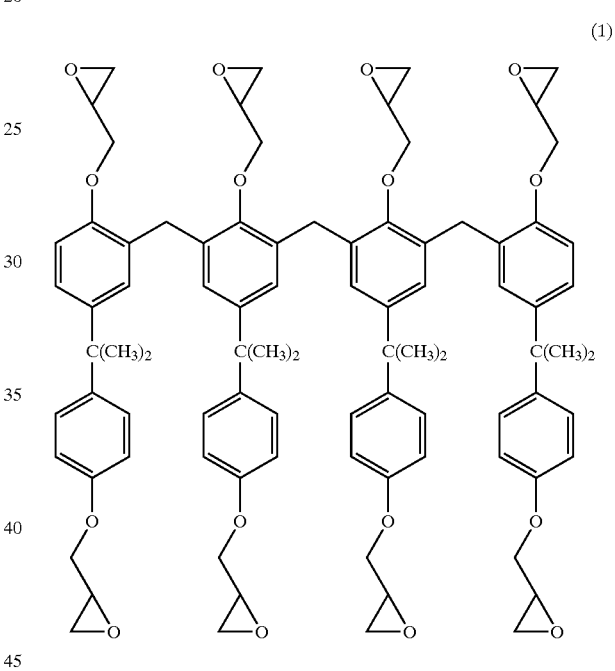

(1)

A polycaprolactone polyol reactive diluent is preferrably used. This contains hydroxy groups capable of reacting with epoxy groups under the influence of a strong acid catalyst, serving as reactive diluent for the epoxy resin.

TONE® 201 obtained from Union Carbide is a difunctional polycaprolactone polyol with a number average molecular weight of about 530 gram/mole, with the structure shown as formula (2), where R is a proprietary aliphatic hydrocarbon group, and with average n=2.

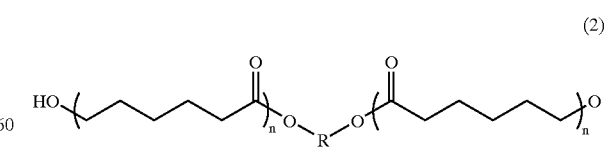

(2)

Union Carbide TONE® 305 is a trifunctional polycaprolactone polyol with a number average molecular weight of about 540 gram/mole, with the structure shown as formula (3), where R is a proprietary aliphatic hydrocarbon group and with average n=1.

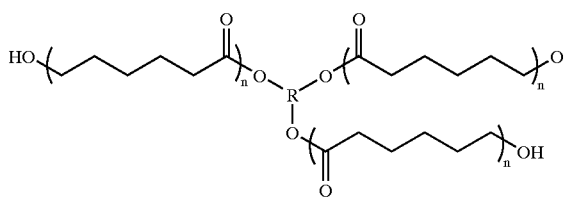

(3)

The preferred photoacid generator consists of a triaryl sulfonium salt with structure shown below as formula (4), where Ar represents a mixture of aryl groups. Such a material is commercially available from Union Carbide under the trade name CYRACURE® Cationic Photoinitiator UVI-6974, which consists of a 50% solution of compound of formula (4) dissolved in propylene carbonate.

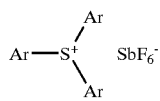

(4)

A suitable solvent must be included to dissolve all ingredients and lower the viscosity such that the composition may be applied by spin-coating. Suitable solvents include, but are not limited to, gamma-butyrolactone, cyclopentanone, propylene glycol methyl ether acetate, cyclohexanone, methyl ethyl ketone, and the like.

Optionally, a nonionic surfactant such as FC430 obtained from 3M may be added to the composition at about 0.05 parts per hundred parts solids to improve coating uniformity.

The above ingredients are mixed in an amber glass bottle under yellow light and rolled under moderate heat (about 60° C.) under a heatlamp until all solids were dissolved. The solution is filtered by passing a warm solution through a 5.0 micron pore size nylon or Teflon membrane filter in order to remove particulate matter, which might cause coating defects or act as a undesirable polymerization catalyst.

The types of substrates can be, but are not limited to, silicon, silicon dioxide, alumina, gallium arsenide, metal, or deposited metal on silicon. No special pre-treatment is necessary; optionally, a pre-bake may be performed to remove absorbed moisture. The resulting photoresist solution may be applied to a substrate by spin-coating, consisting of dispensing the liquid resist onto the substrate, accelerating to a constant rotational speed, and holding the rotation speed constant to achieve the desired coating thickness. Spin-coating may be performed with variable rotational velocity in order to control the thickness of the final coating. After spin-coating, a bake is performed to evaporate solvent; typically 1 minute at 65° C. followed by 5–10 minutes at 95° C. on a hotplate. The solid photoresist coating can then be photoimaged using an exposure tool with near-ultraviolet radiation from a medium- or high-pressure mercury lamp through a photomask containing a pattern of opaque and transparent regions. Contact, proximity, or projection printing may be used. Following exposure, a post-exposure-bake is carried out in order to accelerate the acid catalyzed polymerization reaction in the exposed regions of the coating; typical bakes are carried out on a hotplate for 1 minute at 65° C. and 5 minutes at 95° C. The coating is then immersed in an organic solvent developer in order to dissolve away the un-polymerized regions, typically for 2–5 minutes depending on the thickness of the coating. Suitable developer solvents include, but are not limited to, propylene glycol methyl ether acetate, gamma-butyrolactone, acetone, and ethyl lactate. Optionally, a post-bake may be performed on the resulting image to more fully harden the material.

The resulting three dimensional structures obtained in the described fashion may be used for electroplating molds, microelectromechanical systems (MEMS) devices, microfluidic devices, and other applications apparent to those skilled in the art.

The present invention is further described in detail by means of the following Examples and Comparisons. All parts and percentages are by weight and all temperatures are degrees Celsius unless explicitly stated otherwise.

EXPERIMENTAL PROCEDURES

EXAMPLE 1

A photoresist composition comprising a mixture of 95 wt % of EPON® SU-8 Resin and 5 wt % of TONE® 305 polyol, with 10 parts of CYRACURE® UVI 6974 per hundred parts by weight of resin and reactive diluent and 66 parts of gamma-butyrolactone as the solvent per hundred parts by weight of resin and reactive diluent, was mixed in an amber bottle and rolled on ajar roller under a heatlamp for about 3 hours until all solids were dissolved, then filtered using a syringe through a 5.0 micron pore size nylon membrane filter. The solution was applied to a silicon wafer substrate by spin-coating at 1050 rpm for 30 seconds, followed by pre-baking on a hot-plate at 95° C. for 8 minutes produce a clear, tack-free coating which had a film thickness of 30 microns.

The coating was exposed to about 450 millijoules/cm$^2$ near-ultraviolet (i-line) radiation through a chromium-on-quartz photomask. Hardening by crosslinking was accomplished by a post-exposure-bake on a hotplate at 95° C. for 5 minutes. The unexposed, uncrosslinked regions of the coating were dissolved away by immersion in a developer bath of propylene glycol methyl ether acetate, leaving a negative-tone image of the photomask. Inspection showed a significant amount of cracking occurred in the imaged features, especially at the corners of the features. However, the amount of cracking that occurred was less than a sample containing 0% polyol modifier run under identical conditions (see Comparative Example 1).

EXAMPLE 2

The method according to Example 1 was repeated except the composition comprised 90 wt % of EPON® SU-8 Resin and 10 wt % of TONE® 305 polyol, with 10 parts of CYRACURE® UVI 6974 per hundred parts by weight of resin and reactive diluent and 60 parts of gamma-butyrolactone per hundred parts by weight of resin and reactive diluent. The solution was applied to a silicon wafer substrate by spin-coating at 1050 rpm for 30 seconds, followed by pre-baking on a hot-plate at 95° C. for 8 minutes produce a clear, tack-free coating which had a film thickness of 32 microns.

A photoresist coating was photoimaged using the method described in Example 1. Inspection showed that significantly less cracking was observed than for the Example 1.

EXAMPLE 3

The method according to Example 1 was repeated except the composition comprised 80 wt % of EPON® SU-8 Resin and 20 wt % of TONE® 305 polyol, with 10 parts of CYRACURE® UVI 6974 per hundred parts by weight of resin and reactive diluent and 55 parts of gamma-butyrolactone per hundred parts by weight of resin and reactive diluent. The solution was applied to a silicon wafer substrate by spin-coating at 1050 rpm for 30 seconds, followed by pre-baking on a hot-plate at 95° C. for 8 minutes produce a clear, tack-free coating which had a film thickness of 29 micros.

A photoresist coating was photoimaged using the method described in Example 1. Inspection showed that significantly less cracking was observed than for either Example 1 or Example 2. Furthermore, the wafer was subjected to a rapid thermal cycle room temperature to 230° C. for three minutes on a hot-plate, then rapidly back to room temperature by placing the wafer on a cool surface; this cycle did not result in any cracking.

COMPARATIVE EXAMPLE 1

The method according to Example 1 was repeated except the composition comprised 100 wt % of EPON® SU-8 Resin, with 10 parts of CYRACURE® UVI 6974 per hundred parts by weight of resin and 65 parts of gamma-butyrolactone per hundred parts by weight of resin and reactive diluent. The solution was applied to a silicon wafer substrate by spin-coating at 1050 rpm for 30 seconds, followed by pre-baking on a hot-plate at 95° C. for 8 minutes produce a clear, tack-free coating which had a film thickness of 32 microns.

A photoresist coating was photoimaged using the method described in Example 1. Inspection showed that a large amount of cracking occurred especially at the corners and edges of features, similarly to Example 1. The wafer was subjected to a rapid thermal cycle from room temperature to 230° C. then back to room temperature by the method described in Example 3; this cycle resulted in severe cracking and delamination of the cured material from the substrate.

COMPARATIVE EXAMPLE 2

The method according to Example 1 was repeated except the composition comprised 70 wt % of EPON® SU-8 Resin and 30 wt % of TONE® 305 polyol, with 10 parts ht of CYRACURE® UVI 6974 per hundred parts by weight of resin and reactive diluent and 52 parts of gamma-butyrolactone per hundred parts by weight of resin and reactive diluent. The solution was applied to a silicon wafer substrate by spin-coating at 1050 rpm for 30 seconds, followed by pre-baking on a hot-plate at 95° C. for 8 minutes produce a coasting which had a thickness of 24 microns. However, after cooling the appearance of the coating showed a haziness, and inspection determined that some phase separation had occurred. Furthermore, upon contact the coating was slightly soft and tacky, making this material unsuitable for contact printing since severe mask sticking would then occur.

COMPARATIVE EXAMPLE 3

Then method according to Example 1 was repeated except the composition comprised 70 wt % of EPON® SU-8 Resin and 30 wt % of TONE® 201 difunctional polyol, with 10 parts of CYRACURE® UVI 6974 per hundred parts by weight of resin and reactive diluent and 59 parts of gamma-butyrolactone per hundred parts by weight of resin and reactive diluent. The solution showed a slight haziness both before and after filtering. The solution was applied to a silicon wafer substrate by spin-coating at 750 rpm for 30 seconds, followed by pre-baking on a hot-plate at 95° C. for 8 minutes produce a coasting which had a thickness of 21 microns. Upon contact the coating was very soft and tacky, making this material also unsuitable for contact printing.

EXAMPLE 4

In order to compare adhesion and stress-induced cracking properties, two photoresist samples comprising the (A) the formulation described in Example 1 and (B) the formulation described in Comparative Example 1 were spin-coated onto square substrates of 75 mm dimension, comprised of copper sheeting coated on the reverse side by a coating of Kapton® polyimide. The coatings were dried by baking on a hotplate for 3 minutes at 65° C., followed by 6 minutes at 95° C. The spin speed during spin-coating was adjusted to give coatings with thickness of 45–55 microns after drying.

Individual coated samples were flood exposed using radiation from a mercury xenon lamp at a total exposure dose of about 800 mJ/cm$^2$. The samples were post exposure baked by hotplate for 65° C. for 1 minute, then 95° C. for 5 minutes.

A cured sample of each (A) and (B) was subjected to an adhesion peel test meeting the standards set forth in ASTM Test Method D3359, using a Cross-Cut Kit obtained from Precision Gage and Tool Co., 375 Gargrave Road, Dayton, Ohio. The surface of the respective coating ,was scored using a 2 mm blade supplied with the kit, then Permacel 99 test tape was applied and peeled back from the coating surface. The resulting adhesion loss is reported on a scale of 5B (best: 0% of crosshatched coating removed) and 0B (worst: >65% of crosshatched coating removed). The results are shown below in Table 1.

TABLE 1

Cross-cut adhesion test results.

| Coating Material | Result |
| --- | --- |
| (A) Example 1 | 4B–5B (0–<5% film removed) |
| (B) Comparative Example 1 | 1B–2B (35–65% film removed) |

After post exposure bake bake, a sample of each was baked on a hotplate at 150° C. for 30 minutes. Shrinkage of the epoxy coating due to thermally-induced curing was found to cause stress-induced curvature of the samples. The coupon dimensions were used as a means to measure stress-induced bowing. As a measure of curvature the distances of the respective samples were measured diagonally from corner to corner. The results are reported in Table 2.

TABLE 2

Stress-induced curvature test results.

| | Diagonal | | |
| --- | --- | --- | --- |
| Coating material | After PEB | After 30 min/ 150° C. | Δ |
| (A) Example 1 | 100 mm | 55 mm | 45 mm |
| (B) Comparative Example 1 | 103 mm | 90 mm | 13 mm |

In addition, a coupon with each coating was subjected to a spindle test that consisted of rolling the coupon around a ⅓" diameter cylinder twice in the direction of the stress-induced curvature (bowing) of the coupon, and twice in the opposite direction, i.e. opposing the coupon's curvature. The effect on the coating was noted after completion of the forward and reverse rolling; results are given in below Table 3.

TABLE 3

Film spindle test results.

| Coated Material | Forward Roll | Reverse Roll |
|---|---|---|
| (A) Example 1 | No cracking | Film cracking; no adhesion loss |
| (B) Comparative Example 1 | No cracking | Extensive film fracture; adhesion loss |

While the invention has been described above with reference to specific embodiments thereof, it is apparent that many changes, modifications, and variations can be made without departing from the inventive concept disclosed herein. Accordingly, it is intended to embrace all such changes, modifications and variations that fall within the spirit and broad scope of the appended claims. All patent applications, patents and other publications cited herein are incorporated by reference in their entirety.

What is claimed is:

1. A photoimageable composition suitable for use as a negative photoresist comprising:
   (a) about 75% to about 95% by weight of at least one epoxidized polyfunctional bisphenol A formaldehyde novolak resin;
   (b) about 5% to about 25% by weight of at least one polycaprolactone polyol reactive diluent, wherein the sum of (a) and (b) equals 100%;
   (c) at least one photoacid generator in an amount from about 2.5 to about 12.5 parts per hundred parts of resin and reactive diluent, which initiates polymerization upon exposure to near-ultraviolet radiation; and
   (d) a sufficient amount of casting solvent to dissolve (a), (b) and (c); wherein said casting solvent is selected from the group consisting of gamma-butyrolactone, cyclopentanone, propylene glycol methyl ether acetate, cyclohexanone and methyl ethyl ketone.

2. The composition of claim 1 wherein the composition additionally contains a nonionic surfactant in an amount of about 0.05 parts per hundred parts solids.

3. A photoimageable composition suitable for use as a negative photoresist comprising:
   (a) about 75% to about 95% by weight of an epoxidized polyfunctional bisphenol A formaldehyde novolak resin having an average of about eight epoxy groups and having an average molecular weight of 1400 gram/mole and having an epoxy equivalent weight of about 215 gram/mole;
   (b) about 5% to about 25% by weight of a difunctional or trifunctional polycaprolactone polyol reactive diluent, wherein the sum of (a) and (b) equals 100%;
   (c) a triaryl sulfonium hexafluoroantimonate salt in an amount from about 2.5 to about 12.5 parts per hundred parts of the sum of (a) and (b), which initiates polymerization upon exposure to near-ultraviolet radiation; and
   (d) a sufficient amount of casting solvent to dissolve (a), (b) and (c) wherein the casting solvent is selected from a group consisting of gamma-butyrolactone, cyclopentanone, propylene glycol methyl ether acetate, cyclohexanone and methyl ethyl ketone.

4. The composition of claim 3 wherein the casting solvent is gamma-butyrolactone.

5. The composition of claim 3 wherein the composition additionally contains a nonionic surfactant in an amount of about 0.05 parts per hundred parts solids.

6. The process of photoimaging a substance comprising the steps of:
   (1) preparing a photoimageable composition suitable for use as a negative photoresist comprising:
      (a) about 75% to about 95% by weight of at least one epoxidized polyfunctional bisphenol A formaldehyde novalak resin;
      (b) about 5% to about 25% by weight of at least one polycaprolactone polyol reactive diluent, wherein the sum of (a) and (b) equals 100%;
      (c) at least one photoacid generator in the amount from about 2.5 to about 12.5 parts per hundred parts of resin and reactive diluent, which initiates polymerization upon exposure to near-ultraviolet radiation; and
      (d) a sufficient amount of casting solvent to dissolve (a), (b) and (c) wherein the casting solvent is selected from the group consisting of gamma-butyrolactone, cyclopentanone, propylene glycol methyl ether acetate, cyclohexanone and methyl ethyl ketone;
   (2) applying this photoimageable composition to a substance in a thickness from about 1 micron to about 100 microns;
   (3) exposing the coated substrate to patterned near-ultraviolet radiation to photo image the photoresist coating;
   (4) conducting a post-exposure bake on the photoimaged, coated substrate; and
   (5) developing the photo imaged photoresist coating with an organic solvent developer to dissolve away the unpolymerized regions and leave negative photoresist image on the substrate.

7. The process of claim 6 wherein the substrate is selected from the group consisting of silicon, silicon dioxide, alumina, gallium arsenide, metal, and deposited metal on silicon.

8. The process of claim 6 wherein applying step (b) is carried out by spin-coating the photoimaging composition onto the substrate.

9. The process of claim 6 wherein exposing step (c) is carried out by using an exposure tool with near-ultraviolet radiation from a medium or high-pressure mercury lamp through a photomask containing a pattern of opaque and transparent regions.

10. The process of claim 6 wherein after applying step (b) and prior to exposing step (c) the coated substrate is baked to evaporate the casting solvent.

11. The process of photoimaging a substrate composing the steps of:
   (1) preparing a photoimageable composition suitable for use as a negative photoresist comprising:
      (a) about75% to about 95% by weight of an epoxidized polyfunctional bisphenol A formaldehyde novalak resin having an average of about eight epoxy groups and having an average molecular weight of 1400 gram/mole and having an epoxy equivalent weight of about 215 gram/mole;
      (b) about 5% to about 25% by weight of a difunctional or trifunctional polycaprolactone polyol reactive diluent, wherein the sum of (a) and (b) equals 100%;

(c) a triaryl sulfonium hexafluoroantimonate salt in an amount from about 2.5 to about 12.5 parts per hundred parts of the sum of (a) and (b); and (d) a sufficient amount of casting solvent to dissolve (a), (b) and (c) wherein said casting solvent is selected from the group consisting of gamma-butyrolactone, cyclopentanone, propylene glycol methyl ether acetate, cyclohexanone and methyl ethyl ketone;

(2) applying this photo imagable composition to a substrate in a thickness from about 1 micron to about 100 microns;

(3) exposing the coated substrate to patterned near-ultraviolet radiation to photoimage the photoresist coating;

(4) conducting a post-exposure bake on the photoimaged, coated substrate; and (5) developing the photoimaged photoresist coating with an organic solvent developer to dissolve away the unpolymerized regions and leave a negative photoresist image on the substrate.

12. The process of claim 11 wherein the substrate is selected from the group consisting of silicon, silicon dioxide, alumina, gallium arsenide, metal and deposited metal on silicon.

13. The process of claim 11 wherein applying step (b) is carried out by spin-coating the photoimaging composition onto the substrate.

14. The process of claim 11 wherein after applying step (b) and prior to exposing step (c) the coated substrate is baked to evaporate the casting solvent.

* * * * *